United States Patent
Lai et al.

(10) Patent No.: US 7,768,784 B2
(45) Date of Patent: Aug. 3, 2010

(54) HEAT DISSIPATION ASSEMBLY

(75) Inventors: Cheng-Tien Lai, Taipei Hsien (TW); Jin-Song Feng, Shenzhen (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1 day.

(21) Appl. No.: 12/269,858

(22) Filed: Nov. 12, 2008

(65) Prior Publication Data

US 2009/0059536 A1  Mar. 5, 2009

Related U.S. Application Data

(63) Continuation-in-part of application No. 11/782,459, filed on Jul. 24, 2007, now abandoned.

(51) Int. Cl.
*H05K 7/20* (2006.01)
(52) U.S. Cl. ............ 361/710; 361/679.54; 361/704; 361/719; 165/80.3; 165/104.33; 174/16.3; 248/505; 248/510
(58) Field of Classification Search ............ 361/679.46, 361/679.47, 679.52, 679.54, 690–695, 700–712, 361/717–724; 165/80.2, 80.3, 80.4, 80.5, 165/104.33, 185; 257/706–727; 174/15.1, 174/16.3, 252; 24/295, 296, 457, 458, 495, 24/517, 546, 573, 625; 248/316.7, 505, 510; 411/516, 522, 523, 520
See application file for complete search history.

(56) References Cited

U.S. PATENT DOCUMENTS

| | | | | |
|---|---|---|---|---|
| 5,477,916 A * | 12/1995 | Lin | ........... | 165/80.3 |
| 5,493,475 A * | 2/1996 | Lin | ........... | 361/710 |
| 6,344,971 B1* | 2/2002 | Ju | ........... | 361/704 |
| 6,556,443 B1* | 4/2003 | Wei | ........... | 361/704 |
| 6,707,672 B2* | 3/2004 | Liu | ........... | 361/704 |
| 6,822,869 B2* | 11/2004 | Huang et al. | ........... | 361/704 |
| 6,934,157 B2* | 8/2005 | Figuerado et al. | ........... | 361/704 |
| 7,180,746 B2* | 2/2007 | Yu et al. | ........... | 361/719 |
| 7,436,671 B2* | 10/2008 | Chen et al. | ........... | 361/710 |
| 7,515,419 B2* | 4/2009 | Li et al. | ........... | 361/704 |

\* cited by examiner

*Primary Examiner*—Michael V Datskovskiy
(74) *Attorney, Agent, or Firm*—Frank R. Niranjan

(57) ABSTRACT

A heat dissipation assembly includes a heat sink, a retention module surrounding the heat sink, and a pair of wire clips pivotably attached to the retention module to press the heat sink against an electronic component on a printed circuit board. The retention module includes three walls surrounding a rectangular opening through which the heat sink contacts with the electronic component. Two barbs and two supporting members are formed on the three walls. Each clip includes a pivoting section retained in one supporting member, an abutting section pressing the heat sink toward the electronic component, and a locking section locked with one barb, a connecting section connecting the abutting section with the pivoting section, and a handle formed from the locking section. Each clip is entirely located at a corresponding side of the heat sink.

11 Claims, 5 Drawing Sheets

HEAT DISSIPATION ASSEMBLY

RELATED APPLICATION DATA

The present application is a continuation-in-part (CIP) application of patent application Ser. No. 11/782,459 entitled "HEAT DISSIPATING DEVICE ASSEMBLY" and filed on Jul. 24, 2007 now abandoned.

BACKGROUND OF THE INVENTION

1. Field of the Invention

The present invention relates to a heat dissipation assembly, and more particularly to a heat dissipation assembly incorporating a locking device for securing a heat sink to a printed circuit board conveniently.

2. Description of Related Art

As computer technology continues to advance, electronic components such as central processing units (CPUs) of computers are made to provide faster operational speed and greater functional capabilities. When a CPU operates at a high speed in a computer enclosure, its temperature increases greatly and dramatically. It is desirable to dissipate the generated heat quickly, for example, by using a heat sink attached to the CPU in the enclosure. This allows the CPU and other electronic components in the enclosure to function within their normal operating temperature ranges, thereby assuring the quality of data management, storage and transfer. Generally, a locking device is required for mounting the heat sink to the CPU.

U.S. Pat. No. 6,339,533 shows a heat dissipating device, which comprises a heat sink and a locking device. The heat sink comprises a base and a plurality of fins extending from the base. A pair of shoulders are formed on two lateral sides of the base. The locking device comprises a retention module and a pair of clips. Each clip has a pair of locking feet defining locking openings therein and slots adjacent to the locking openings. Four barbs are formed at four corners of the retention module. In assembly, the retention module is mounted on a printed circuit board which supports the heat sink on an electronic component thereof beforehand. The clips are disposed on the shoulders of the heat sink in a manner that the locking opening of one locking foot of each clip engages with a corresponding barb of the retention module. Tool is then inserted into the slot of other locking foot of each clip, pivoting the other locking foot locked with an adjacent barb of the retention module, thereby securing the heat sink to the electronic component. However, it is inconvenient to use tool in assembly.

What is needed, therefore, is a heat dissipation assembly which can overcome the above-mentioned disadvantages.

SUMMARY OF THE INVENTION

A heat dissipation assembly includes a heat sink, a retention module surrounding the heat sink, and a pair of wire clips pivotably attached to the retention module to press the heat sink against an electronic component on a printed circuit board. The retention module includes three walls surrounding a rectangular opening through which the heat sink contacts with the electronic component. Two barbs and two supporting members are formed on the three walls of the retention module at four corners thereof, wherein one barb is alternate with one supporting member. Each clip includes a pivoting section rotatably retained in one supporting member, an abutting section pressing the heat sink toward the electronic component, and a locking section locked with one barb, a connecting section connecting the abutting section with the pivoting section, and a handle formed from the locking section. The sections of each clip are all located at a corresponding side of the heat sink. The two clips press the heat sink at two opposite sides thereof, keeping the heat sink on the electronic component in a balanced manner. Compared with the conventional locking device, there is no need to use tool in assembly of the heat dissipation assembly of the present invention, whereby an assembling process thereof becomes relatively convenient.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
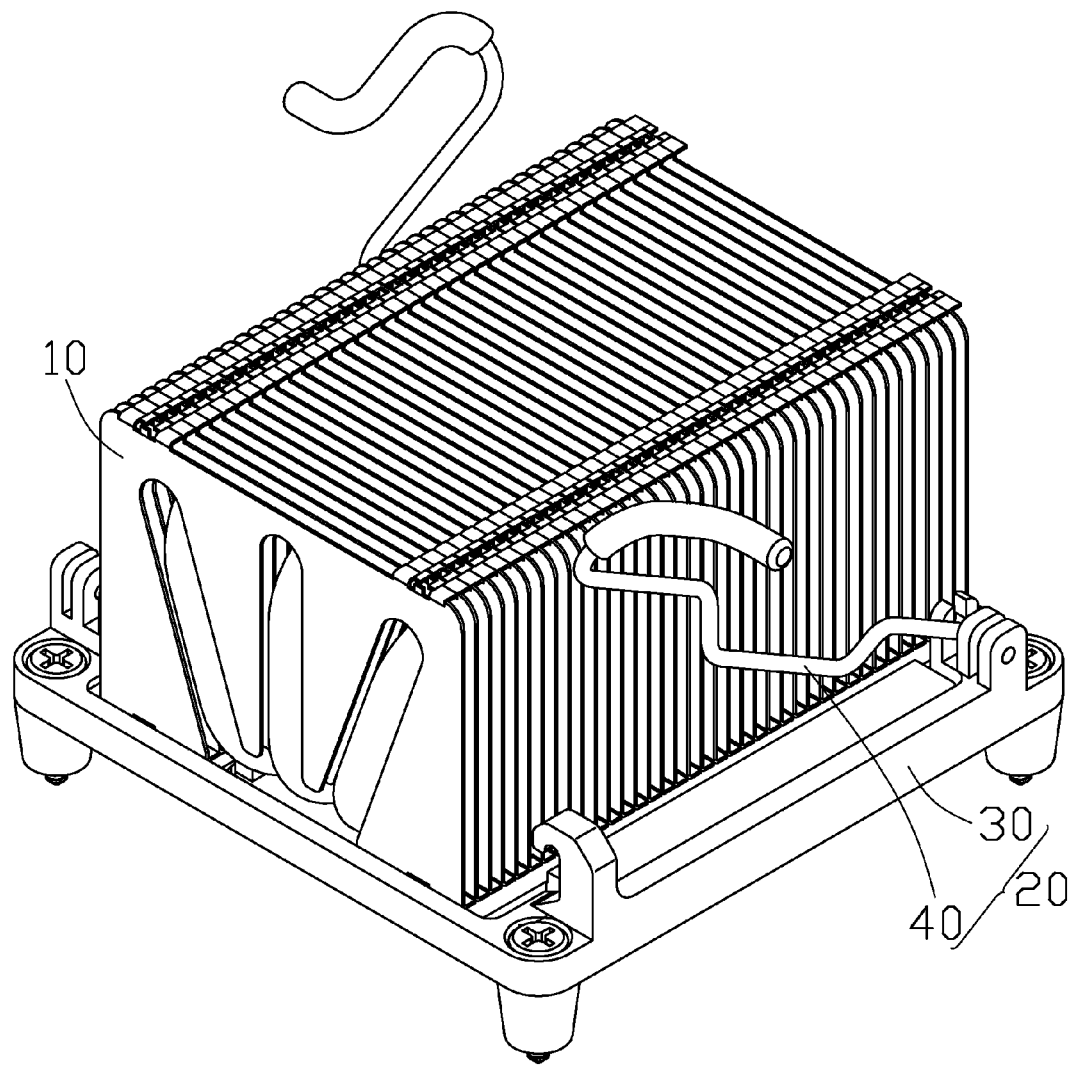
FIG. 1 is an assembled view of a heat dissipation assembly in accordance with a preferred embodiment of the present invention, wherein two clips of the heat dissipation assembly are held in released positions.

Referring to FIG. 1, a heat dissipation assembly in accordance with a preferred embodiment of the present invention is disclosed. The heat dissipation assembly comprises a heat sink 10 and a locking device 20 mounted on the heat sink 10.

Figure 2:
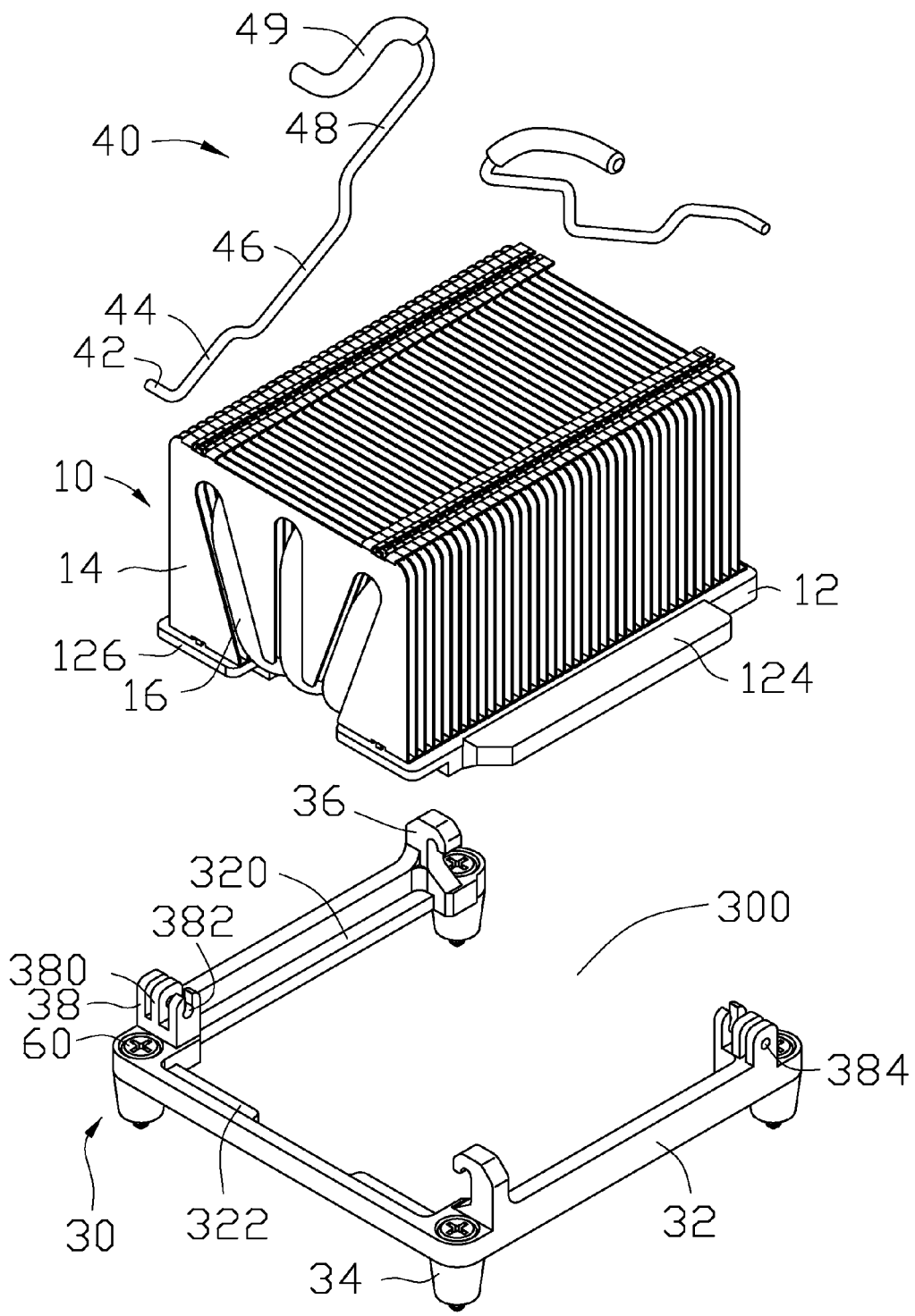
FIG. 2 is an exploded view of FIG. 1.
Figure 3:
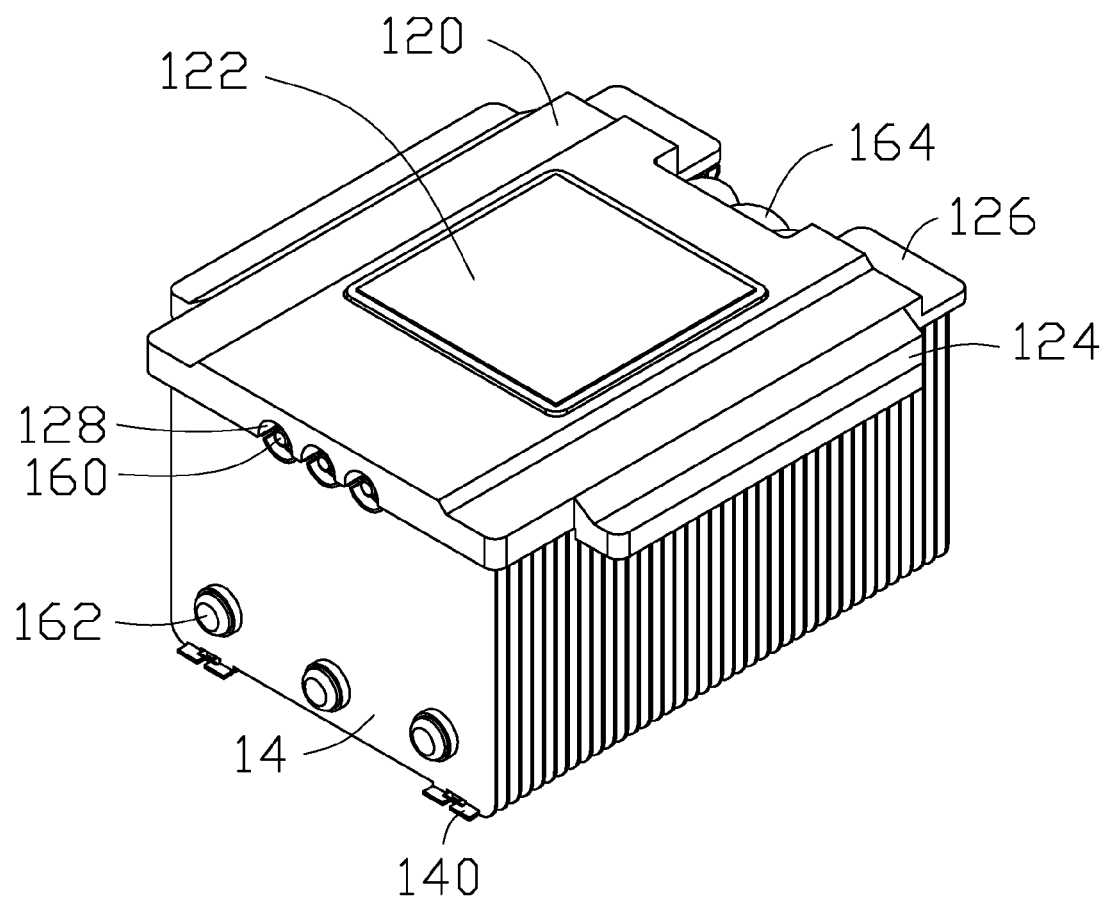
FIG. 3 is an inverted view of a heat sink of the heat dissipation assembly of FIG. 2.
Figure 5:
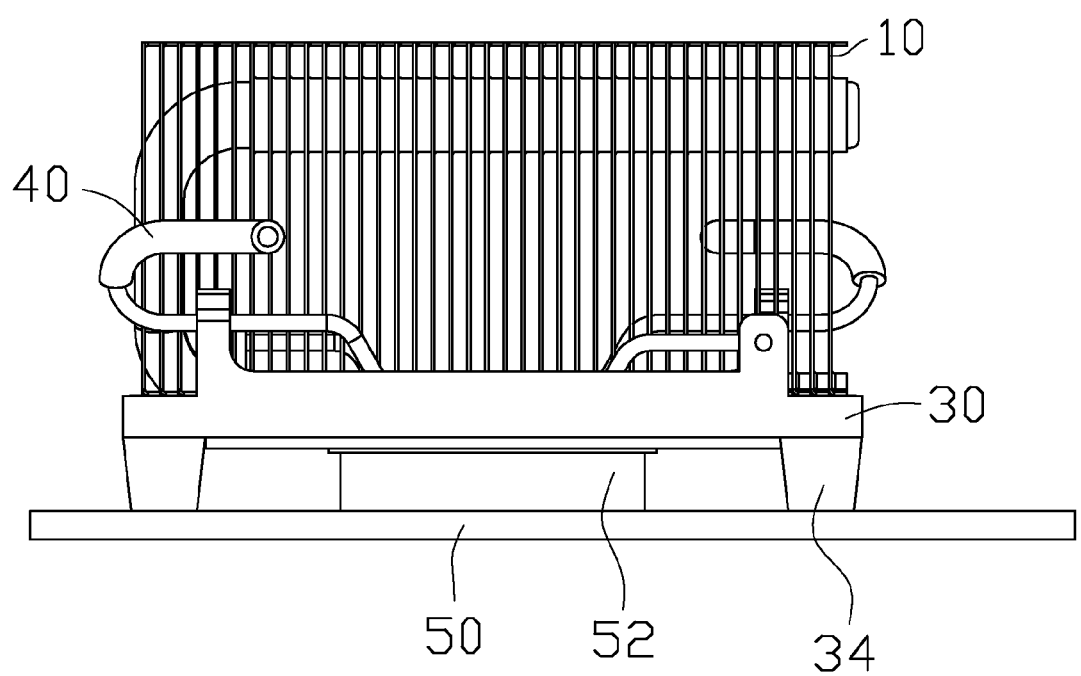
FIG. 5 is a front view of FIG. 4, with the heat dissipation assembly being mounted on a printed circuit board.

Also as shown in FIGS. 2-3 and 5, the heat sink 10 comprises a metal base 12, a plurality of fins 14 fixed on a top face of the base 12, and three U-shaped heat pipes 16 attached on the base 12 and inserted within the fins 14. The base 12 comprises a rectangular substrate 120 (see FIG. 3), a square protrusion 122 projecting downwardly from a center of a bottom face of the substrate 120, and a pair of shoulders 124 extending horizontally and outwardly from two opposite sides (i.e., a front and rear sides) of the substrate 120, respectively. Three grooves 128 are defined in the top face of the substrate 120, partially receiving three evaporating sections 160 of the three heat pipes 16 therein, respectively. Each shoulder 124 is located at a corresponding side of the substrate 120 along a length thereof. The protrusion 122 is for contacting with an electronic component 52 (see FIG. 5) mounted on a printed circuit board 50 and transferring heat generated thereby to the fins 14 via the substrate 120. A pair of steps 126 are formed laterally and horizontally from a left side of the substrate 120. A gap (not labeled) is defined between the steps 126 for facilitating mounting of evaporating sections 160 and adiabatic sections 164 of the three heat pipes 16 into the fins 14 of the heat sink 10. The fins 14 are self-locked by flanges 140 formed on tops and bottoms thereof. In addition to being partially received in the grooves 128 of the substrate 120, the evaporating sections 160 of the heat pipes 16 are also partially accommodated within the bottoms of the fins 14, whereby the evaporating sections 160 of the heat pipes 16 are sandwiched between the fins 14 and the base 12. The three heat pipes 16 each further comprise a condensing section 162 parallel to the evaporating section 160 thereof, conveying the heat absorbed by the evaporating section 160 thereof to the fins 14. The condensing sections 162 and the adiabatic sections 164 of the three heat pipes 16 are all embedded in the fins 14, except tips of the condensing sections 162 exposed out of the fins 14.

The locking device 20 comprises a retention module 30 and a pair of clips 40 pivotably mounted thereon. The retention module 30 is constructed by three elongated walls 32, surrounding a rectangular opening 300 which communicates with an outside of the retention module 30 in a right direction as viewed from FIG. 2. A front wall 32 and a rear wall 32 of the retention module 30 each form a strip 320 extending inwardly and horizontally therefrom, and a left wall 32 thereof forms two spaced tabs 322 extending towards the right direction. The two shoulders 124 and steps 126 of the heat sink 10 are configured to be supported by the two strips 320 and tabs 322 of the retention module 30, respectively, whereby the heat sink 10 can be stably situated on the retention module 30 at three adjacent sides thereof. Four hollow posts 34 are formed at two joints of the three walls 32 and two free ends of the front wall 32 and the rear wall 32, respectively. Four screws 60 are received in the four posts 34, wherein each screw 60 has an exposed bottom end for threadedly securing the retention module 30 on a top of the printed circuit board 50. A barb 36 is formed at the free end of the rear wall 32, adjacent to an inner side of a corresponding post 34 and at a level higher than that of the corresponding post 34. A supporting member 38 is formed on the joint of the rear wall 32 and the left wall 32 and located adjacent to an inner side of a corresponding post 34 and at a level higher than that of the corresponding post 34. The supporting member 38 comprises three parallel plates 380 extending upwardly and perpendicularly from the joint of the rear wall 32 and the left wall 32, wherein an innermost plate 380 defines a cutout 382 depressing downwardly from a middle of a top portion thereof, and other two plates 380 each define a through hole 384 in a middle portion thereof. The through holes 384 are aligned with each other. Another supporting member 38 and another barb 36, which have configurations similar to the supporting member 38 and the barb 36, are formed on the free end of the front wall 32 and the joint of the front wall 32 and the left wall 32, respectively. The two supporting members 38 are symmetrical with respect to a center of the retention module 30, and so do the two barbs 36.

Figure 4:
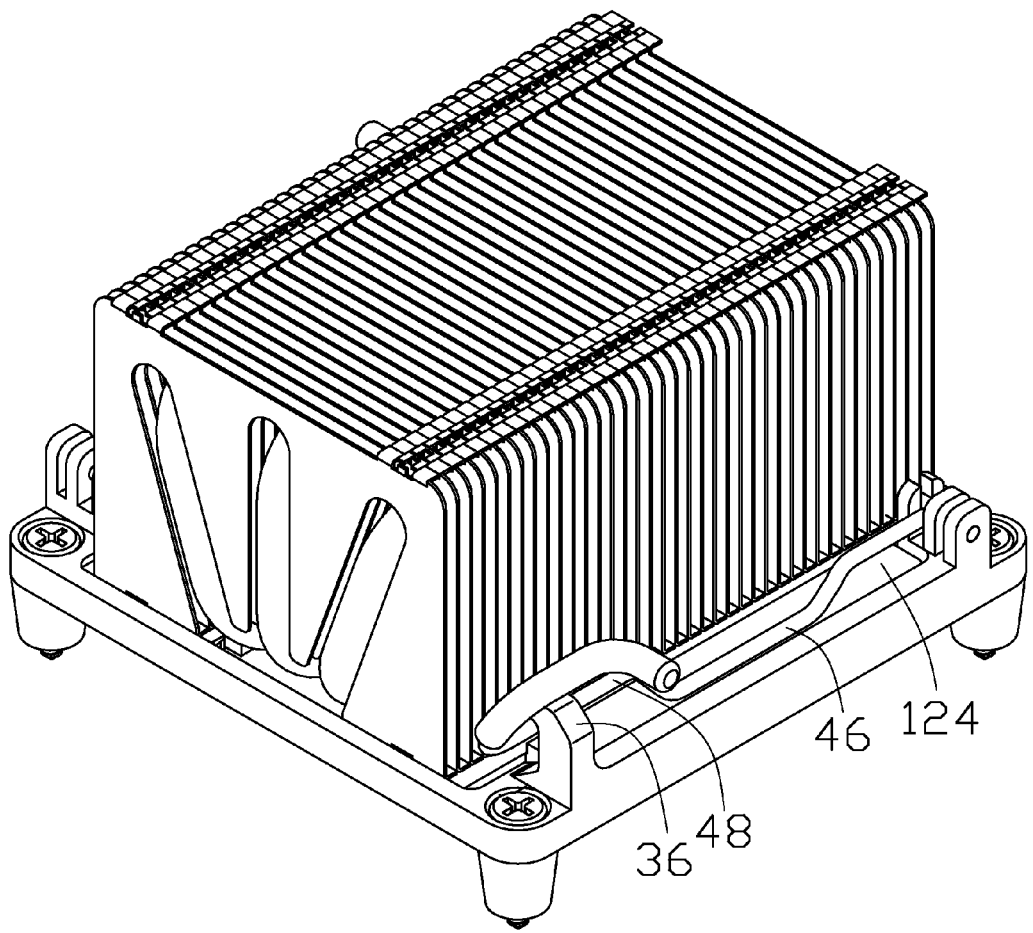
FIG. 4 is a view similar to FIG. 1, wherein the two clips are held in locked positions.

Also referring to FIG. 4, the two clips 40 are substantially mounted to the front wall 32 and the rear wall 32 of the retention module 30, respectively, pressing the heat sink 10 towards the printed circuit board 50 downwardly. Each clip 40 is bent from a metal wire, comprising a pivoting section 42, a downwardly recessed abutting section 46, a handle 49, a connecting section 44 interconnecting the pivoting section 42 and the abutting section 46, and a locking section 48 coupling the abutting section 46 with the handle 49. The pivoting section 42 of each clip 40 is retained in the through holes 384 of the two plates 380 of a corresponding supporting member 38 of the retention module 30, confining the clip 40 to be rotated around the supporting member 38 between a locked position (see FIG. 4) in which the abutting section 46 is deformed upwardly to press against the shoulder 124 of the heat sink 10 downwardly toward the printed circuit board 50, and a released position (see FIG. 1) in which the abutting section 46 is pulled away from the shoulder 124. The connecting section 44 is oriented perpendicular to the pivoting section 42. With manipulation of the handle 49, the locking section 48 can be rotated downwardly to lock with the barb 36, holding the clip 40 in the locked position reliably.

In assembly, the retention module 30 with the two clips 40 readily secured thereon, is fixed on the printed circuit board 50 by extending the four screws 60 through the four posts 34 thereof into the printed circuit board 50, surrounding the electronic component 52 therein. The two clips 40 are rotated to first horizontal orientations where the handles 49 thereof are located away from the barbs 36 of the retention module 30. The heat sink 10 is disposed on the retention module 30 and supported by the two strips 320 and the tabs 322 of the retention module 30. Then the two clips 40 are pivoted to second horizontal orientations to be locked with the barbs 36, urging the abutting sections 46 against the shoulders 124 downwardly. Therefore, the heat sink 10 is firmly secured on the printed circuit board 50.

By use of the two pivotable clips 40, an assembling process of the whole heat dissipation assembly is predigested, among which what a user needs to do is only to rotate the two clips 40 to their locked positions. Furthermore, since no tool is required in assembly, the whole assembling process of the heat dissipation assembly becomes relatively convenient.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation assembly, comprising:
a heat sink;
a retention module supporting and surrounding the heat sink, the retention module comprising three walls surrounding a rectangular opening which communicates with an outside of the retention module in a horizontal direction, a pair of barbs and a pair of supporting members being formed on the three walls of the retention module at four corners thereof, one barb being alternate with one supporting member; and
a pair of wire clips pivotably mounted to two opposite sides of the retention module for pressing against the heat sink downwardly, each of the wire clips comprising a pivoting section pivotably retained in a corresponding supporting member, an abutting section abutting against the heat sink, and a locking section which is pivotable to be locked with a corresponding barb of the retention module, wherein each of the wire clips is substantially located at a corresponding one of the two opposite sides of the retention module;
wherein two opposite ones of the three walls each form a strip extending inwardly, and the remaining one of the three walls forms a pair of spaced tabs extending inwardly, the heat sink being disposed on the two strips and the two tabs of the retention module.

2. The heat dissipation assembly as claimed in claim 1, wherein each of the wire clips further comprises a connecting section interconnecting the abutting section and the pivoting section, the connecting section being perpendicular to the pivoting section.

3. The heat dissipation assembly as claimed in claim 2, wherein the abutting section of each of the wire clips is recessed downwardly from the locking section towards the connecting section thereof.

4. The heat dissipation assembly as claimed in claim 1, wherein each of the supporting members comprises three parallel plates, two adjacent ones of the three plates each defining a through hole in a middle thereof for receiving the pivoting section of a corresponding wire clip, the remaining one of the three plates defining a cutout depressing downwardly from a middle of a top thereof.

5. The heat dissipation assembly as claimed in claim 1, wherein the heat sink comprises a base, a plurality of fins fixed on a top face of the base, and a plurality of heat pipes embedded in the plurality of fins and the base, the heat sink being surrounded by the three walls of the retention module.

6. The heat dissipation assembly as claimed in claim 5, wherein the base of the heat sink comprises a substrate, a pair of shoulders extending outwardly from the substrate along two opposite directions, and a pair of steps extending outwardly from the substrate along a same direction, the pair of steps being placed on the two tabs of the retention module, and the pair of shoulders being placed on the two strips of the retention module and pressed by the abutting sections of the pair of wire clips.

7. A heat dissipation assembly, comprising:
a heat sink;
a retention module supporting the heat sink, the retention module comprising three walls at three adjacent sides thereof, the three walls surrounding a rectangular opening which is opened towards another side of the retention module different from the three adjacent sides thereof; and
a pair of wire clips mounted on two opposite of the sides of the retention module, each of the wire clips comprising a pivoting section pivotably attached to the retention module, an abutting section pressing against the heat sink downwardly, and a locking section locked with the retention module;
wherein the abutting section, the pivoting section and the locking section of each of the wire clips are located at a same one of the two opposite sides of the retention module; and
wherein the retention module further comprises two strips and two tabs extending inwardly from the three walls thereof, and the heat sink comprises two steps and two shoulders disposed on the two strips and the two tabs of the retention module, the two shoulders of the heat sink being pressed by the pair of clips, respectively.

8. The heat dissipation assembly as claimed in claim 7, wherein the heat sink is supported by the retention module at three adjacent sides thereof.

9. The heat dissipation assembly as claimed in claim 7, wherein the retention module further comprises two barbs and two supporting members formed on the three walls thereof and at four corners of the retention module, one barb being alternate with one supporting member, the pivoting section of each wire clip being pivotably connected with a corresponding supporting member, and the locking section of each wire clip being engagingly connected with a corresponding barb.

10. The heat dissipation assembly as claimed in claim 7, wherein each of the wire clips further comprises a connecting section interconnecting the abutting section and the locking section, and a handle connected to the locking section, the connecting section of each of the wire clips being perpendicular to the pivoting section thereof.

11. A heat dissipation assembly, comprising:
a heat sink;
a retention module supporting and surrounding the heat sink, the retention module comprising three walls surrounding a rectangular opening which communicates with an outside of the retention module in a horizontal direction, a pair of barbs and a pair of supporting members being formed on the three walls of the retention module at four corners thereof, one barb being alternate with one supporting member; and
a pair of wire clips pivotably mounted to two opposite sides of the retention module for pressing against the heat sink downwardly, each of the wire clips comprising a pivoting section pivotably retained in a corresponding supporting member, an abutting section abutting against the heat sink, and a locking section which is pivotable to be locked with a corresponding barb of the retention module, each of the wire clips being substantially located at a corresponding one of the two opposite sides of the retention module;
wherein each of the supporting members comprises three parallel plates, two adjacent ones of the three plates each defining a through hole in a middle thereof for receiving the pivoting section of a corresponding wire clip, and the remaining one of the three plates defining a cutout depressing downwardly from a middle of a top thereof.

* * * * *